US006844605B2

(12) United States Patent
Nishimura (10) Patent No.: US 6,844,605 B2
(45) Date of Patent: Jan. 18, 2005

(54) MAGNETIC MEMORY USING PERPENDICULAR MAGNETIZATION FILM

(75) Inventor: Naoki Nishimura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 46 days.

(21) Appl. No.: 10/255,697

(22) Filed: Sep. 27, 2002

(65) Prior Publication Data

US 2003/0081467 A1 May 1, 2003

(30) Foreign Application Priority Data

Sep. 28, 2001 (JP) ........................................ 2001-301771

(51) Int. Cl.[7] .............................................. H01L 29/82
(52) U.S. Cl. ....................... 257/421; 365/158; 365/171; 365/173; 360/324.2
(58) Field of Search ................................ 365/158, 171, 365/173; 360/324.2

(56) References Cited

U.S. PATENT DOCUMENTS

| | | | |
|---|---|---|---|
| 6,005,798 A | * 12/1999 | Sakakima et al. | 365/158 |
| 6,055,179 A | 4/2000 | Koganei et al. | 365/158 |
| 6,219,275 B1 | 4/2001 | Nishimura | 365/173 |
| 6,373,609 B1 | 4/2002 | Mizrahi | 359/161 |
| 6,639,765 B2 | * 10/2003 | Adachi et al. | 360/324.2 |

OTHER PUBLICATIONS

E. Y. Chen, et al., "Submicron Spin Valve Magnetoresistive Random Access Memory Cell" Journal Of Applied Physics, vol. 81, No. 8, pp. 3992–3994 (Apr. 15, 1997).

* cited by examiner

Primary Examiner—David Nelms
Assistant Examiner—Mai-Huong Tran
(74) Attorney, Agent, or Firm—Fitzpatrick, Cella, Harper & Scinto (57) ABSTRACT

In a magnetoresistive element of a magnetic memory, a inversion field Hc of at least a first magnetic layer is given by

$$Hc = \frac{2(Ku - 2\pi Ms^2 f)}{Ms}$$

where Ku and Ms are the perpendicular magnetic anisotropy constant and saturation magnetization of the first magnetic layer. The inversion field Hc is set smaller than a magnetic field generated by a magnetic field generation mechanism. Letting T be the film thickness of the first magnetic layer and W be the width and length, f is a factor given by

$$f = 7 \times 10^{-13}(T/W)^4 - 2 \times 10^{-9}(T/W)^3 + 3 \times 10^{-6}(T/W)^2 - 0.0019(T/W) + 0.9681$$

A magnetic memory manufacturing method is also disclosed.

11 Claims, 5 Drawing Sheets

MAGNETIC MEMORY USING PERPENDICULAR MAGNETIZATION FILM

BACKGROUND OF THE INVENTION

1. Field of the Invention

The present invention relates to a magnetic thin-film element using a magnetoresistance effect such as a spin tunneling effect and an application of this element and, more particularly, to an application of a nonvolatile memory.

2. Related Background Art

A magnetic thin-film memory is a solid-state memory having no movable portion, like a semiconductor memory. The magnetic thin-film memory is more advantageous than the semiconductor memory because the magnetic thin-film memory keeps information even upon power-off, has an infinite repetitive rewrite count, and is free from the risk of losing recording contents even by incident radiation. Recently, a thin-film magnetic memory using a spin tunneling (TMR) effect has received a great deal of attention because it can obtain a larger output than a conventional magnetic thin-film memory using an anisotropic magnetoresistance effect. These magnetic memories are called MRAMs (Magnetic Random Access Memories) due to their random access characteristics.

As the memory cell area decrease, the magnetic thin-film memory with the above arrangement cannot ignore a demagnetizing field (self-demagnetizing field) generated in a magnetic layer. The magnetization direction of a recording/sustaining magnetic layer cannot settle and becomes unstable. Hence, the magnetic thin-film memory having the above arrangement cannot save information at the same time as miniaturization of a bit cell, and cannot be integrated at a high degree.

To solve the integration problem of the longitudinal magnetization film, the present inventor discloses a magnetoresistive element using a perpendicular magnetization film in U.S. Pat. No. 6,219,275. This magnetoresistive element has a superior characteristic of stably conserving magnetization even upon miniaturization.

The longitudinal magnetization film is known to increase its inversion field along with miniaturization. For example, it is reported in Journal of Applied Physics (J. Appl. Phys.) Vol. 81, p. 3992, 1997 that the inversion field increases in proportion to the reciprocal of the width in the longitudinal magnetization film and reaches as large as about 260 Oe for 0.25 µm. If the magnetic film is miniaturized, the inversion field is considered to further increase.

In the MRAM, information is recorded by the switching magnetization of a magnetic film by a magnetic field generated by supplying a current to a write line. An increase in inversion field increases the write current and power consumption. Furthermore, recording itself fails if a current equal to or higher than the limiting current density is required.

An increase in inversion field along with miniaturization may also occur in a perpendicular magnetization film. Miniaturization with a constant film thickness increases the shape anisotropy (to be described later). The magnetization occurs more readily in the perpendicular direction, thus increasing energy accompanying switching.

The present invention has been made in consideration of the above situation, and has as its object to provide a magnetic thin-film element which exhibits a magnetoresistance effect and is thermally stable in an MRAM using a perpendicular magnetization film without any increase in inversion field which poses a problem in miniaturization.

SUMMARY OF THE INVENTION

To solve the above problems, the present inventor has found a factor caused by an increase in inversion field in a perpendicular magnetization film, and has found a film structure which does not increase the inversion field even upon miniaturization in terms of the physical value of a magnetic film. The present inventor has also found the conditions of the physical value of a film which does not switch its magnetization by heat even upon miniaturization.

More specifically, according to the present invention, there is provided a magnetic memory having a magnetoresistive element in which a nonmagnetic layer is interposed between first and second magnetic layers formed from perpendicular magnetization films, a inversion field of the second magnetic layer is not larger than a inversion field of the first magnetic layer, and a resistance value upon supplying a current between the first and second magnetic layers changes depending on a relative angle between magnetization directions of the first and second magnetic layers, and a magnetic field generation mechanism which applies a magnetic field to the magnetoresistive element, wherein a inversion field Hc of at least the first magnetic layer is given by equation (1), and the inversion field Hc is set smaller than a magnetic field generated by the magnetic field generation mechanism:

$$Hc = \frac{2(Ku - 2\pi Ms^2 f)}{Ms} \quad (1)$$

where Ku and Ms are a perpendicular magnetic anisotropy constant and saturation magnetization of the first magnetic layer, and letting T be a film thickness of the first magnetic layer and W be a width and length, f is a factor given by $$f = 7 \times 10^{-13}(T/W)^4 - 2 \times 10^{-9}(T/W)^3 + 3 \times 10^{-6}(T/W)^2 - 0.0019(T/W) + 0.9681 \quad (2)$$

There is also provided a magnetic memory having a magnetoresistive element in which a nonmagnetic layer is interposed between first and second magnetic layers formed from perpendicular magnetization films, a inversion field of the second magnetic layer is smaller than a inversion field Hc of the first magnetic layer, and a resistance value upon supplying a current between the first and second magnetic layers changes depending on a relative angle between magnetization directions of the first and second magnetic layers, wherein Q given by equation (3) for saturation magnetization Ms of the first magnetic layer, a perpendicular anisotropy constant Ku, and f given by equation (4) is not less than 100:

$$Q = \frac{v(Ku - 2\pi Ms^2 f)}{kTa} \quad (3)$$

$$f = 7 \times 10^{-13}(T/W)^4 - 2 \times 10^{-9}(T/W)^3 + 3 \times 10^{-6}(T/W)^2 - 0.0019(T/W) + 0.9681 \quad (4)$$

where k is a Boltzmann constant, Ta is a temperature, T is a film thickness, and W is a width.

There is also provided a method of manufacturing a magnetic memory having a magnetoresistive element in which a nonmagnetic layer is interposed between first and second magnetic layers formed from perpendicular magnetization films, a inversion field of the second magnetic layer is not smaller than a inversion field of the first magnetic layer, and a resistance value upon supplying a current between the first and second magnetic layers changes depending on a relative angle between magnetization directions of the first and second magnetic layers, comprising setting large saturation magnetization as at least the first magnetic layer is miniaturized.

There is also provided a method of manufacturing a magnetic memory having a magnetoresistive element in which a nonmagnetic layer is interposed between first and second magnetic layers formed from perpendicular magnetization films, a inversion field of the second magnetic layer is not smaller than a inversion field of the first magnetic layer, and a resistance value upon supplying a current between the first and second magnetic layers changes depending on a relative angle between magnetization directions of the first and second magnetic layers, comprising setting a small perpendicular anisotropy constant as at least the first magnetic layer is miniaturized.

DETAILED DESCRIPTION OF THE PREFERRED EMBODIMENTS

A preferred embodiment of the present invention will be described in more detail below with reference to the accompanying drawings.

Figure 7:
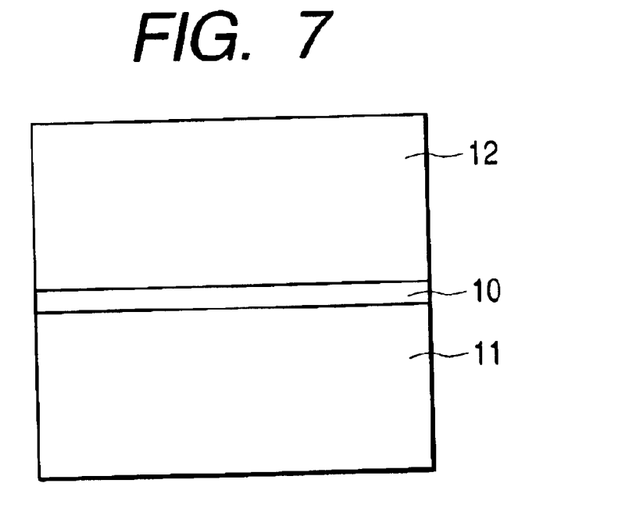
FIG. 7 is a schematic sectional view showing an example of a magnetoresistive element used in a magnetic memory according to the present invention.

First Embodiment:

FIG. 7 shows a magnetoresistive element according to the first embodiment. The magnetoresistive element is constituted by stacking a first magnetic layer 11 formed from a perpendicular magnetization film, a nonmagnetic layer 10, and a second magnetic layer 12 formed from a perpendicular magnetization film. The inversion field of the second magnetic layer 12 is larger than that of the first magnetic layer 11. The resistance value upon supplying a current between the first and second magnetic layers 11 and 12 changes depending on the relative angle between the magnetization directions of the first and second magnetic layers 11 and 12. When the magnetoresistive element is used as an MRAM memory element, a magnetic field generation mechanism (not shown) is arranged to switch the magnetization direction of the first magnetic layer 11 of the magnetoresistive element.

To record information on this memory element, a magnetic field is applied to the magnetoresistive element by using the magnetic field generation mechanism, thereby changing the magnetization direction of the first magnetic layer 11 to an upward or downward direction perpendicular to the film surface. The second magnetic layer 12 is magnetized in advance to the upward or downward direction perpendicular to the film surface so as not to change the magnetization direction in recording, read, or save of information. Thus, the magnetization direction of the first magnetic layer 11 determines the resistance value of the magnetoresistive element. Information is read out by detecting the resistance value of the magnetoresistive element.

To integrate magnetic memories at a high degree, the magnetic film must be miniaturized. However, miniaturizing the magnetic film increases a magnetic field necessary to switch the magnetization direction, i.e., a inversion field, as described above. This will be explained in detail for the perpendicular magnetization film.

In general, it is known that a demagnetizing field is generated in a direction opposite to the magnetization direction. For example, in a film magnetized perpendicularly to the film surface, i.e., a perpendicular magnetization film, the demagnetizing field has a magnitude of $4\pi Ms$ for an infinite-size film. Ms represents saturation magnetization, and n represents the circular constant. Of finite-size films, a film having a sufficiently large size with respect to the film thickness can approximate its demagnetizing field by $4\pi Ms$.

Figure 1:
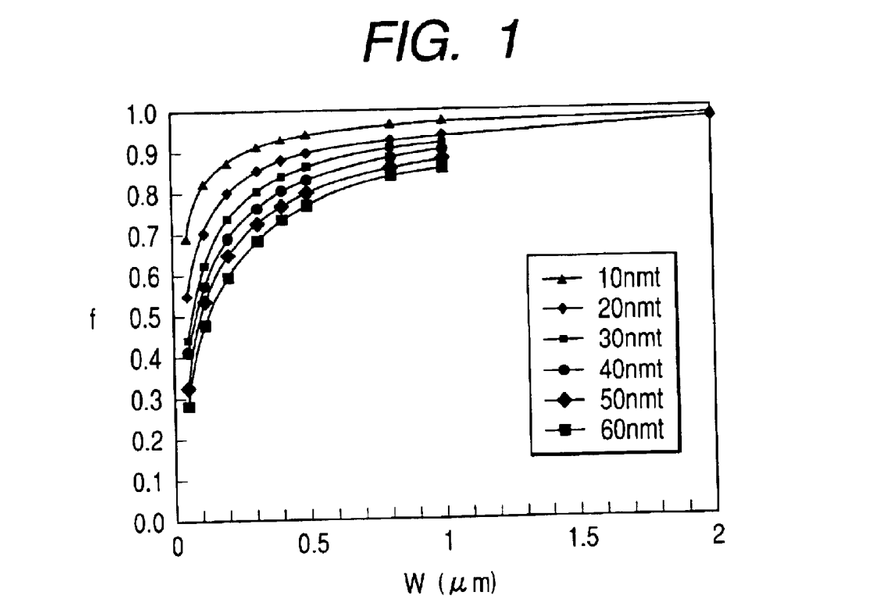
FIG. 1 is a graph showing the relationship between the size of a magnetic film and a factor f normalized using a demagnetizing field magnitude $4\pi Ms^2=1$.
Figure 2:
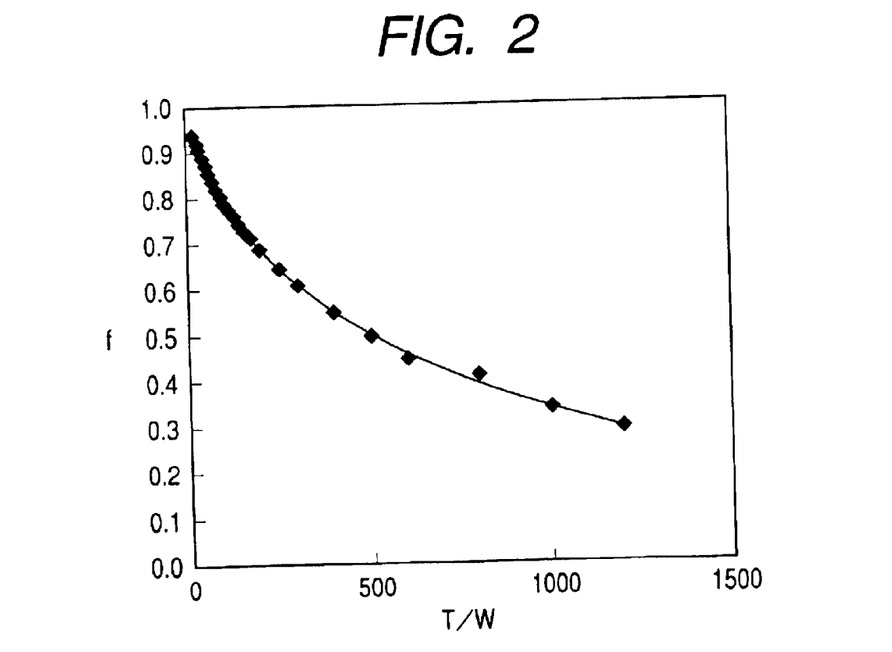
FIG. 2 is a graph showing the relationship between the factor f and the ratio of a film thickness T to width W of the magnetic film.

If, however, the perpendicular magnetization film is miniaturized, a deviation from the approximation cannot be ignored. FIG. 1 shows the ratio (=factor f) for the demagnetizing field magnitude $4\pi Ms=1$, which has found by the present inventor. For example, f=0.5 means that the demagnetizing field is $2\pi Ms$. The size of the perpendicular magnetization film is a width W, length W, and length/width=1, and the film thickness is 10 nm to 60 nm (parameters 10 to 60 nmt in FIG. 1). The degree of decreasing f changes depending on the film thickness, and increases for a larger film thickness. At a size of 1 μm or less, the demagnetizing field cannot be approximated by $4\pi Ms$. For example, in a 50-nm thick perpendicular magnetization film with a size of 0.2 μm×0.2 μm, the demagnetizing field becomes 0.65× $4\pi Ms$, which is smaller than a film having a sufficiently large-size demagnetizing field. The factor f can be substantially approximated by one curve upon normalization using the ratio of the film thickness to width of the perpendicular magnetization film, as shown in FIG. 2. This approximate expression is given by $$f=7\times10^{-13}(T/W)^4-2\times10^{-9}(T/W)^3+3\times10^{-6}(T/W)^2-0.0019(T/W)+0.9681 \qquad (5)$$

where T is the film thickness and W is the width.

Decreasing the demagnetizing field by miniaturization leads to easy perpendicular magnetization. This can be interpreted that perpendicular orientation readily occurs due to the shape anisotropy. The perpendicular magnetization film always switches its magnetization through a process of orientating within the film surface. Thus, miniaturization increases the inversion field.

In a coherent rotation model in which magnetization switching uniformly occurs within the film surface, a perpendicular magnetization film inversion field (=inversion field) Hc is given by $$Hc = \frac{2(Ku - 2\pi Ms^2 f)}{Ms} \quad (6)$$

where f is the value plotted along the ordinate in FIG. 1 or 2, Ku is the perpendicular anisotropy constant, and Ms is the saturation magnetization. Equation (6) also shows that miniaturizing the perpendicular magnetization film increases Hc.

In general, the inversion field of the perpendicular magnetization film is often explained by a domain wall motion model accompanying the motion of the domain wall. After miniaturization, the inversion field must be explained by the coherent rotation model. More specifically, the domain wall width is finite, and if the perpendicular magnetization film is miniaturized to submicron size, the domain wall size becomes much larger with respect to the magnetic film size such that the domain wall cannot exist or the film itself is considered to be the domain wall. In the domain wall motion model, a domain wall between films magnetized upward and downward moves. The domain wall energy changes depending on the location owing to the surface roughness of a substrate or underlayer film below the magnetic film or variations in film thickness. Therefore, the magnetization switching mechanism can be expressed not by the motion of the domain wall but by coherent rotation for a film such as a spin tunneling film whose surface roughness is controlled to minimize.

To record in the magnetic layer of an MRAM, the inversion field Hc in equation (6) must be made smaller than a magnetic field generated by the magnetic field generation apparatus. In other words, a magnetic field considering f must be applied to a memory element.

The magnetic film is generally switched by a magnetic field generated from a write line by supplying a current to the write line. The magnitude of a magnetic field which can be generated from the write line changes depending on the material of the write line or the sectional area of the wiring. The practical MRAM size is at least 1 $\mu$m or less, and for high-degree integration, 0.5 $\mu$m or less, desirably 0.2 $\mu$m or less. Considering this, it is difficult to switch a magnetic film having a inversion field of 500 Oe or more. It is also difficult to switch a magnetic film having a inversion field of 200 Oe or more. In terms of power consumption, it is desirable to use a magnetic film having a inversion field of 100 Oe or less.

The magnitude of the inversion field Hc in equation (6) is at least 500 Oe or less, desirably 200 Oe or less, and further desirably 100 Oe or less.

An excessively small inversion field poses a problem in information conservation. Thus, the magnitude is at least 10 Oe or more, and preferably 20 Oe or more.

Figure 4:
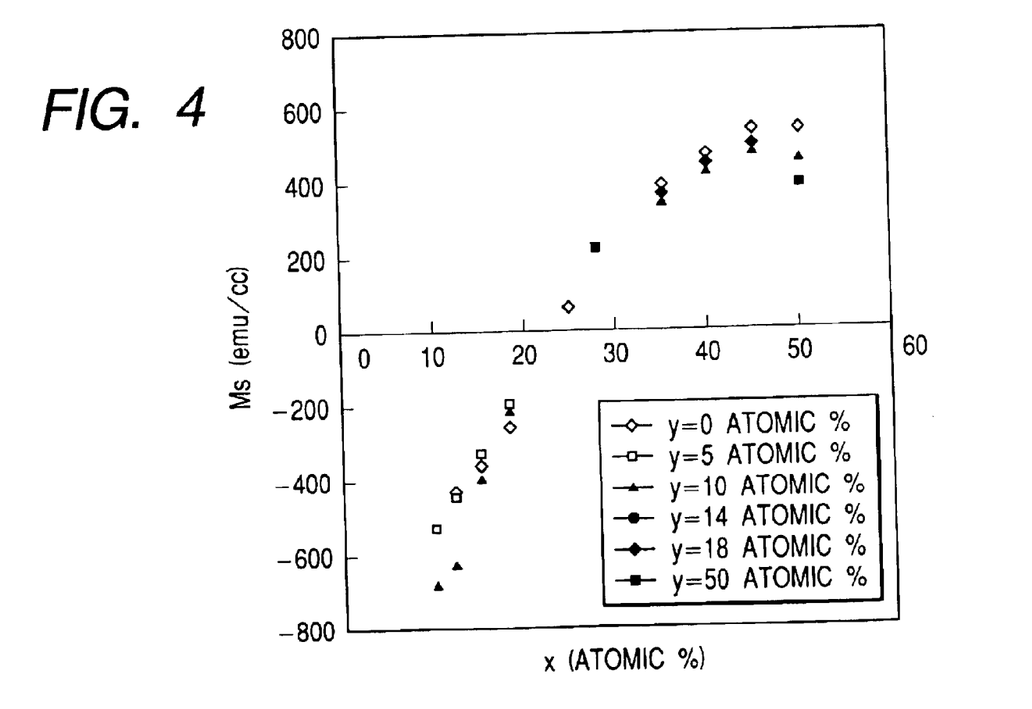
FIG. 4 is a graph showing the relationship between the composition and saturation magnetization Ms of a $Gd_x(Fe_{100-y}Co_y)_{100-x}$ film.

One of methods of setting the coercive force in equation (6) smaller than a magnetic field generated by supplying a current to the write line is to increase the saturation magnetization Ms. For example, when a ferrimagnetic film made of an alloy of a rare-earth element and an iron family element is used as a perpendicular magnetization film, the sublattice magnetization of the rear-earth element and that of the iron family element are antiparallel to each other. The saturation magnetization magnitude can be easily changed by the composition ratio between the rear-earth element and the iron family element. FIG. 4 shows the relationship between the composition and saturation magnetization of a $Gd_x(Fe_{100-y}Co_y)_{100-x}$ film. In FIG. 4, the saturation magnetization Ms is (Gd sublattice magnetization—FeCo sublattice magnetization). A positive value along the ordinate in FIG. 4 means that the sublattice magnetization of the rear-earth element is dominant. A negative value means that the sublattice magnetization of the iron family element is dominant. To increase the saturation magnetization, the rear-earth element is increased for dominant sublattice magnetization of the rear-earth element, and the iron family element is increased for dominant sublattice magnetization of the iron family element.

Since Ms can be easily changed by changing the composition, the method of increasing Ms is effective as a method of reducing the inversion field.

Another method of reducing the inversion field is to decrease the perpendicular anisotropy constant Ku. For example, a ferrimagnetic film made of an alloy of a rear-earth element and iron family element is known to change Ku depending on the type of the rear-earth element. Ku decreases in the order of rear-earth elements Tb, Dy, and Gd. That is, Ku can be controlled by selecting the material of the magnetic film. It is also effective to decrease Ku by adding Sm, Nd, or the like to these ferrimagnetic films. Ku also changes depending on film formation conditions for forming a magnetic film. For example, Ku can be changed by applying a reverse bias to the substrate side or changing sputter gas in film formation.

Memories with various capacities or cell sizes are generally manufactured. In many cases, the size of the magnetic film changes depending on the capacity and memory cell size. An optimum coercive force is determined by the size of the magnetic film, i.e., the degree of interference with an adjacent cell. When a magnetic shield is arranged to prevent the influence of an external magnetic field, the shield structure determines an optimum coercive force. A magnetoresistive element having a desired coercive force (magnetization inversion field) can be manufactured by controlling the saturation magnetization or perpendicular magnetic anisotropy in accordance with necessary conditions. As described above, the saturation magnetization can be easily controlled. Particularly, the ferrimagnetic film made of an alloy of a rear-earth element and iron family element can easily control its saturation magnetization by controlling the composition ratio without changing the material, which is preferable as a manufacturing method. This method can easily cope with a case wherein only the size of the magnetic film is changed by the same semiconductor process of the underlayer.

Second Embodiment:

It is known that when a magnetic substance is miniaturized, magnetization switching occurs by heat energy at a given probability because of super paramagnetism. Super paramagnetism is a phenomenon that when miniaturization of the magnetic substance makes magnetic anisotropy energy equal to heat energy, each magnetic particle thermally vibrates like one atomic magnetic moment of paramagnetism.

Even if the magnetic substance is not miniaturized to a super paramagnetic size, magnetization switching occurs at a given probability of statistical mechanics, and destroys recorded information. This problem has been pointed out for recording media such as a hard disk.

The MRAM also suffers the same problem. In the perpendicular magnetization film, anisotropy energy is given by $Ku-2\pi Ms^2 \times f$, and f must be considered. Letting v be the volume of the magnetic film, a value Q:

$$Q = \frac{v(Ku - 2\pi Ms^2 f)}{kTa} \quad (7)$$

with respect to a temperature energy kT (k is the Boltzmann constant and Ta is the temperature) serves as a criterion representing whether magnetization switching occurs by heat. As far as Q is 100 or more, no practical problem occurs. Also in the present invention, the value in equation (7) is 100 or more, and preferably 200 or more.

In the first and second embodiments, the magnetoresistive element can be one using a giant magnetoresistance effect or one using a spin tunneling effect, and a magnetoresistive element using a spin tunneling effect is preferable. In this case, an insulating film is used as the nonmagnetic layer 10 between the first and second magnetic layers 11 and 12 in the magnetoresistive element shown in FIG. 7, and a current is supplied between the first and second magnetic layers 11 and 12. The thickness of the insulating film is 0.5 nm to 2.5 nm, and preferably 1 nm to 1.6 nm. The material of the insulating film (tunneling barrier layer) is aluminum oxide $Al_2O_3$ or the like.

The first and second magnetic layers are desirably ferrimagnetic films made of an alloy of a rear-earth element and iron family element. The ferrimagnetic film is made of an alloy of one rear-earth element such as Gd, Tb, or Dy and one element such as Fe or Co. Examples of this alloy are GdFe, GdFeCo, TbFe, TbFeCo, DyFe, and DyFeCo. It is preferable to use GdFeCo as the first magnetic layer and TbFeCo or DyFeCo as the second magnetic layer.

Figure 8:
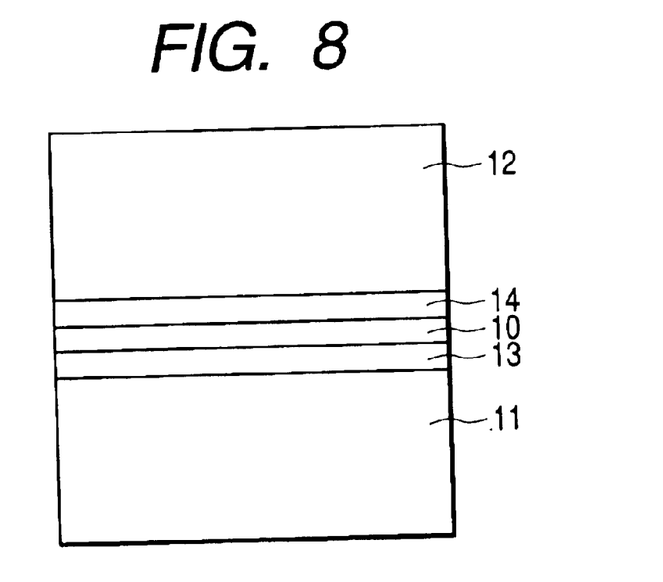
FIG. 8 is a schematic sectional view showing another example of the magnetoresistive element used in the magnetic memory according to the present invention.

To enhance the spin tunneling effect, a material with high spin polarizability is applied to the two sides of the insulating film. More specifically, as shown in FIG. 8, a third magnetic layer 13 is interposed between the first magnetic layer 11 and the nonmagnetic layer 10 in the magnetoresistive element, and a fourth magnetic layer 14 is interposed between the second magnetic layer 12 and the nonmagnetic layer 10. The first and third magnetic layers 11 and 13 are magnetically coupled, whereas the second and fourth magnetic layers 12 and 14 are magnetically coupled. The third and fourth magnetic layers 13 and 14 are made of a material with a higher spin polarizability than that of the first and second magnetic layers 11 and 12. The third and fourth magnetic layers 13 and 14 are preferably made of an alloy of at least one element selected from Fe and Co. The magnetic coupling is preferably exchange coupling. For this purpose, the film thickness of the third and fourth magnetic layers 13 and 14 is desirably about 0.5 nm to 2.5 nm.

An MRAM in which magnetoresistive elements described in the first and second embodiments are arrayed in a matrix will be explained. Bit lines are formed above the magnetoresistive elements. A magnetic field generation mechanism is constituted by the bit lines, a current source for supplying a current to the bit lines, write lines which are arranged near the magnetoresistive elements and apply a magnetic field to the magnetoresistive elements in a direction perpendicular to the film surface, and a current source for supplying a current to the write lines. Only information in a specific one of the magnetoresistive elements arrayed in a matrix is rewritten via bit and write lines. A magnetic field perpendicular to the film surface is applied from the write line, and a magnetic field parallel to the film surface is applied from the bit line. In this case, one specific element near the intersection between these lines receives a magnetic field enough to switch the magnetization. This enables selective recording. For selective read, selector transistors such as field effect transistors may be arranged below the magnetoresistive elements. A diode may be connected to each element to form a passive matrix arrangement.

Figure 9:
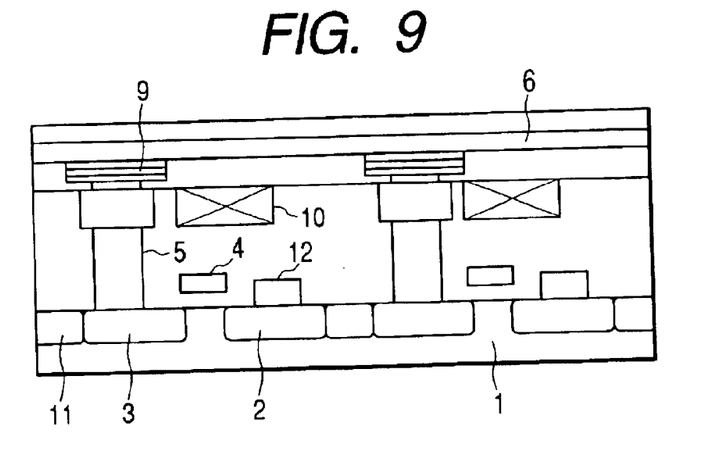
FIG. 9 is a sectional view showing MRAM in which magnetoresistive element according to the first or second embodiment are arranged.
Figure 10:
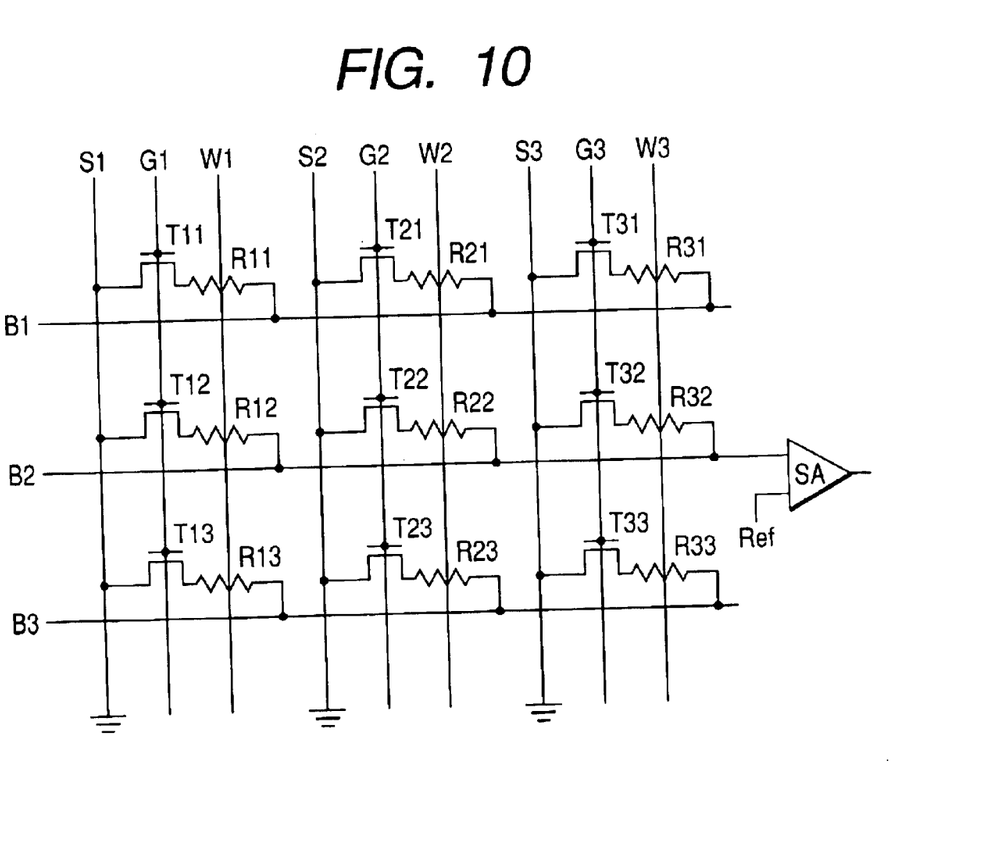
FIG. 10 is an equivalent circuit diagram of MRAM in FIG. 9.

In the above description, information is recorded in the first magnetic layer. Alternatively, a differential detection arrangement may be adopted. In this arrangement, information is recorded in the second magnetic layer, the magnetization of only the first magnetic layer is switched in read, and a resistance change upon switching is detected to reproduce information. FIG. 9 is a sectional view showing this MRAM, and FIG. 10 is an equivalent circuit diagram. The MRAM comprises a semiconductor substrate 1, a source region 2, a drain region 3, a gate electrode 4, a contact plug 5, a bit line 6, a memory element 9, a magnetic field application wiring line 10, an element isolation region 11, and a source electrode 12. In this embodiment, the wiring line 10 is arranged closer to the substrate side than to the memory element 9.

A current flowing through the wiring line 10 generates a magnetic field perpendicular to the film surface of the memory element 9. Thus, the most effective position of the wiring line 10 is just beside the magnetoresistive element. However, alignment requires a sufficient interval in order to avoid electrical short-circuiting between the memory element 9 and the wiring line 10 because the write line is buried after the magnetoresistive element is formed. For this reason, the memory element 9 and wiring line 10 are spaced apart from each other, and a constant write current may reduce a magnetic field applicable to the memory element 9. The wiring line is buried by removing a metal formed at an unwanted portion by CMP (Chemical Mechanical Polishing). When the sectional area of the wiring line is increased for supplying a large write current, stress is applied in the CMP step. In some cases, a buffer layer or the like must be inserted to avoid the influence on the magnetoresistive element. In this case, the wiring line may be arranged closer to the substrate side than to the memory element.

A recording/reproduction method will be explained with reference to the equivalent circuit diagram of FIG. 10 in which memory cells are arrayed in a matrix. This circuit is formed from transistors T11 to T33, memory elements R11 to R33, bit lines B1 to B3, word lines (gate lines) G1 to G3, write lines W1 to W3 (corresponding to the wiring line 10 in FIG. 9), and source lines S1 to S3. Note that the suffix will be omitted if a component need not be discriminated from another. A memory cell made up of a transistor (T22) and memory element (R22) will be exemplified. The bit line B2 is coupled to one terminal of the memory element (R22) in the cell, and connected to one terminal of a sense amplifier (SA). The other terminal of the memory element (R22) is coupled to the drain terminal of the field effect transistor (T22). The source terminal of the field effect transistor (T22) is grounded. The word line (G2) is connected to the gate terminal of the field effect transistor (T22). The write line (W2) is arranged near the magnetoresistive element R22 so as to cross the bit line.

Read operation will be described. A power supply voltage Vdd is applied to the left end of the bit line B2, and a voltage is applied to the word line G2 to turn on the transistor T22. A stationary current flows through R22 to generate a potential corresponding to the resistance value of the memory element R22 at one terminal of the sense amplifier (SA) located at the right end of the bit line B2. The other terminal of the sense amplifier SA receives a potential corresponding to an intermediate value out of two resistance values of the memory element R22. Then, Vdd or 0 V is selected as an output from the sense amplifier SA depending on which of Ref and R22 is higher in resistance.

A method of writing desired information in each cell will be explained. Rewrite of only one layer will be exemplified, but the present invention is not limited to this, and the magnetizations of the two layers may be rewritten. To write information in R22, a current is supplied to B2 and W2. Then, magnetic fields strengthen each other at the intersection of the two wiring lines, and the magnetization of the soft layer (magnetic layer with weaker coercive force) of R22 is switched. By reversing the current direction of W2, an opposite magnetic field can be applied. Information is written by this operation. The write line is so arranged as to apply a magnetic field to the magnetoresistive film in a direction perpendicular to the film surface. An insulating film is interposed between the write line and the magnetoresistive film. The insulating film is arranged for preventing electrical connection between the write line and the magnetoresistive film. This is necessary to prevent degradation of a reproduction signal caused by leakage of a current flowing through the magnetic thin-film element to the write line in reproduction.

If the interval between the write line and the magnetoresistive film is long, a sufficient magnetic field cannot be applied, and if short, dielectric breakdown occurs between the write line and the magnetoresistive film, or a tunneling current flows. From this, the interval is at least 1 nm (inclusive) to 500 nm (inclusive), and desirably 5 nm (inclusive) to 100 nm (inclusive).

EXAMPLES

The present invention will be described in more detail by examples.

Example 1

Figure 5:
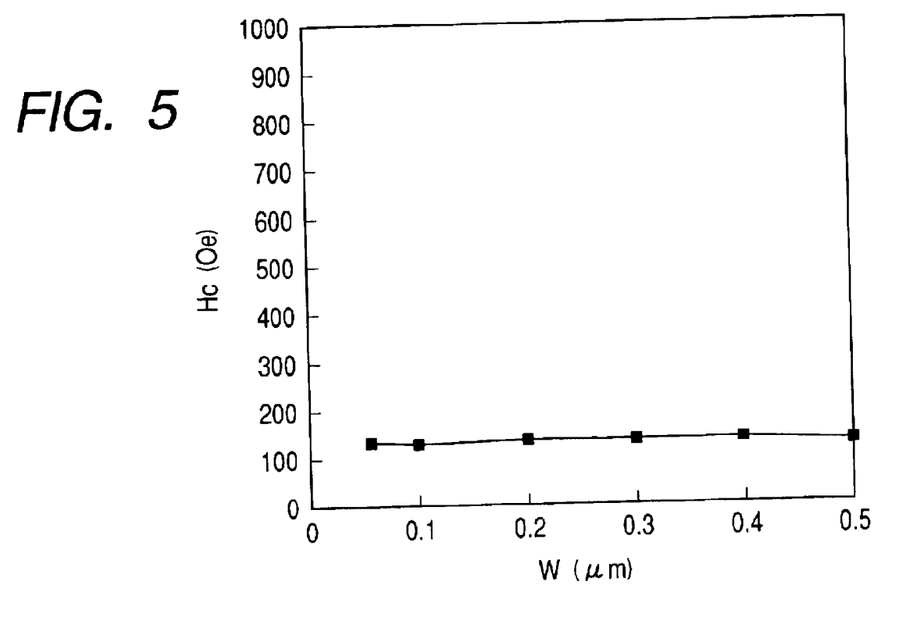
FIG. 5 is a graph showing the relationship between the inversion field and the width of the magnetic film in the present invention.

FIG. 5 and Table 1 show the inversion field Hc and Q when the saturation magnetization Ms is increased along with miniaturization of the magnetic film. The film thickness of the magnetic film is 50 nm. Q is $v \times (Ku - 2\pi Ms^2)/(kT)$ where k is the Boltzmann constant of $1.38 \times 10^{-16}$ erg/K, T is 298 K (room temperature), and v is the volume of the magnetic film (=W×W×film thickness). Q is a value representing the possibility of switching the magnetization of the magnetic substance by thermal agitation. No practical problem occurs as far as Q is 100 or more.

It is apparent from the results that the inversion field does not increase around 130 Oe even with a small width W. In addition, magnetization switching by thermal agitations is free from any problem.

In this manner, an increase in inversion field can be prevented by increasing the saturation magnetization along with downsizing using a ferrimagnet such as an alloy film of a rear-earth element and iron family element as a perpendicular magnetization film.

TABLE 1

| W ($\mu$m) | Ms (emu/cc) | f | Hc (Oe) | Q |
|---|---|---|---|---|
| 0.05 | 190 | 0.33 | 138 | 639 |
| 0.1 | 159 | 0.49 | 130 | 503 |
| 0.2 | 139 | 0.65 | 138 | 466 |
| 0.3 | 132 | 0.72 | 133 | 427 |
| 0.4 | 128 | 0.77 | 136 | 422 |
| 0.5 | 126 | 0.80 | 126 | 386 |

Example 2

Table 2 shows the inversion field and Q when the perpendicular anisotropy constant Ku is changed with a constant saturation magnetization Ms of 126 emu/cc.

TABLE 2

| W ($\mu$m) | Ku (erg/cc) | f | Hc (Oe) | Q |
|---|---|---|---|---|
| 0.05 | 41000 | 0.33 | 128 | 393 |
| 0.1 | 57000 | 0.49 | 131 | 400 |
| 0.2 | 72000 | 0.65 | 120 | 368 |
| 0.3 | 80000 | 0.72 | 124 | 380 |
| 0.4 | 85000 | 0.77 | 129 | 396 |
| 0.5 | 88000 | 0.80 | 126 | 386 |

Comparative Example 1

For a rectangular film with a film thickness T and width W, the inversion field Hc of the longitudinal magnetization film is given by $$Hc = 2\sqrt{2\pi Ms}\, \frac{T}{W} \qquad (8)$$

Figure 6:
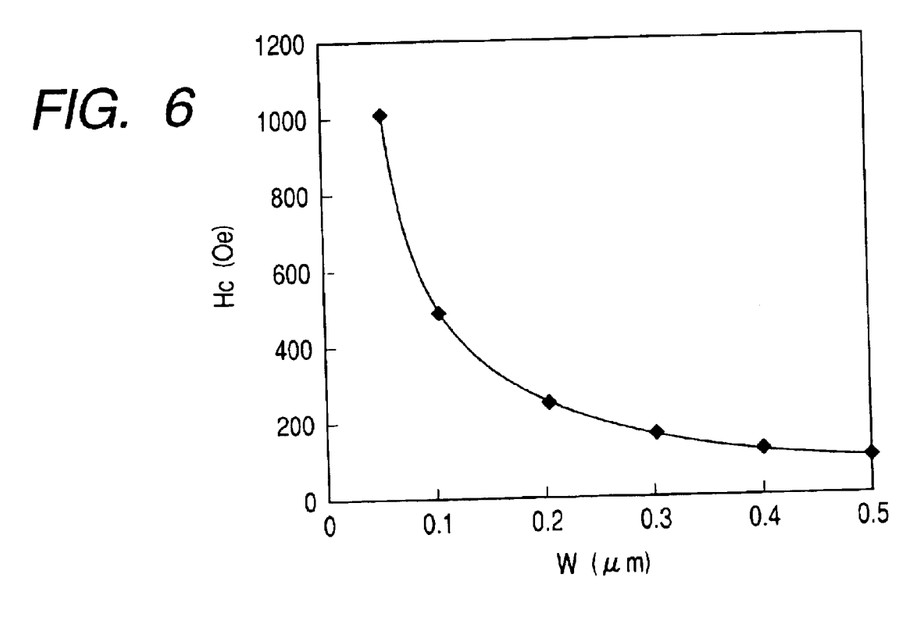
FIG. 6 is a graph showing the relationship between the inversion field of a longitudinal magnetization film and the width of the magnetic film in a comparative example.

For example, for a 5-nm thick NiFe film (Ms=800 emu/cc), the inversion field increases along with downsizing, as shown in FIG. 6. A longitudinal magnetization film generally used in the MRAM is made of NiFe, Co, CoFe, or the like. The saturation magnetization Ms is determined by the material and cannot be changed. For this reason, an increase in inversion field along with downsizing cannot be suppressed, unlike the present invention.

Comparative Example 2

Figure 3:
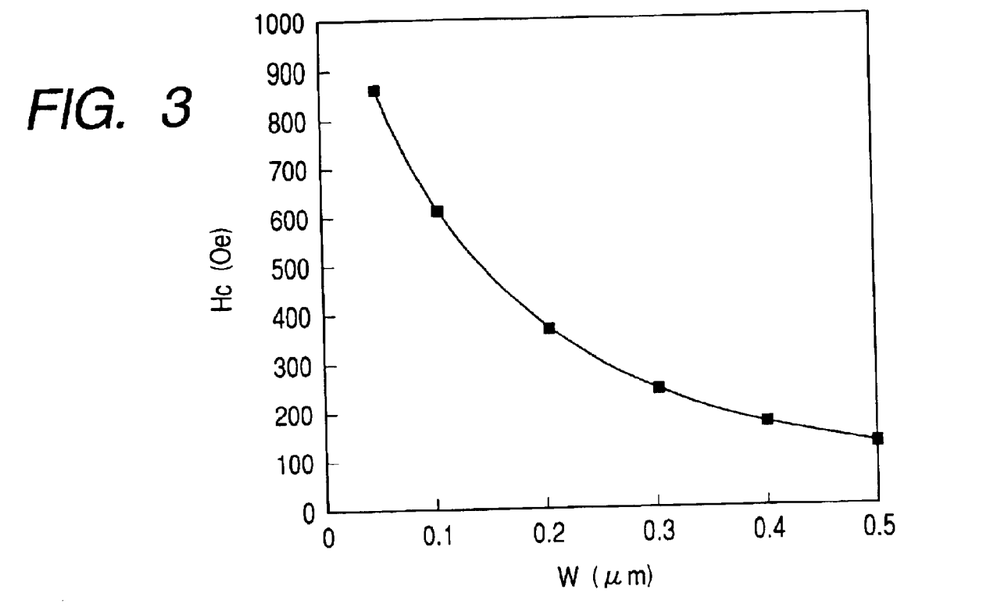
FIG. 3 is a graph showing the relationship between the inversion field of a perpendicular magnetization film and the width of the magnetic film in a comparative example.

FIG. 3 shows the relationship between the width W (=length) and inversion field of a perpendicular magnetization film having a film thickness of 50 nm, Ku=$8.8 \times 10^4$ erg/cc, Ms=126 emu/cc, and a square plane. The inversion field increases along with miniaturization and reaches 672 Oe at 0.1 $\mu$m×0.1 $\mu$m. An increase in inversion field increases the current consumption of the write line, and if the current reaches the limiting current density, write fails.

What is claimed is:
1. A magnetic memory comprising:
    a magnetoresistive element which comprises a nonmagnetic layer interposed between first and second magnetic layers formed from perpendicular magnetization films; and
    a magnetic field generator which applies a magnetic field to the magnetoresistive element,
    wherein an inversion field of the second magnetic layer is larger than an inversion field of the first magnetic layer, and
    wherein an inversion field Hc of at least the first magnetic layer is given by equation (1), and the inversion field Hc is set smaller than a magnetic field generated by the magnetic field generator:

$$Hc = \frac{2(Ku - 2\pi Ms^2 f)}{Ms}, \qquad (1)$$

where Ku and Ms are a perpendicular magnetic anisotropy constant and a saturation magnetization of the first magnetic layer, and f is a factor given by equation (2), in which T is a film thickness of the first magnetic layer, W is a width and length:

$$f=7\times10^{-13}(T/W)^4-2\times10^{-9}(T/W)^3+3\times10^{-6}(T/W)^2-0.0019(T/W)+0.9681 \quad (2)$$

2. A memory according to claim 1, wherein the magnetic field generator includes a write line arranged near the magnetoresistive element, a current source for supplying a current to the write line, a bit line connected to the magnetoresistive element, and a current source for supplying a current to the bit line, and information is recorded in only a designated magnetoresistive element by supplying a current to the bit line and the write line to generate a magnetic field.

3. A memory according to claim 1, wherein the inversion field Hc of the first magnetic layer exhibits not more than 500 Oe.

4. A memory according to claim 1, wherein at least the first magnetic layer is formed from a ferrimagnet formed from an alloy of a rear-earth element and an iron family element.

5. A memory according to claim 4, wherein the first and second magnetic layers are formed from an alloy of at least one rear-earth element selected from the group consisting of Gd, Tb, and Dy and at least one element selected from the group consisting of Fe and Co.

6. A memory according to claim 1, wherein a third magnetic layer is interposed between the first magnetic layer and the nonmagnetic layer, a fourth magnetic layer is interposed between the second magnetic layer and the nonmagnetic layer, and the third and fourth magnetic layers are formed from a material with a higher spin polarizability than a spin polarizability of the first and second magnetic layers.

7. A memory according to claim 6, wherein the third and fourth magnetic layers are formed from an alloy of at least one element selected from the group consisting of Fe and Co.

8. A magnetic memory comprising:

a magnetoresistive element comprising a nonmagnetic layer interposed between first and second magnetic layers formed from perpendicular magnetization films, wherein an inversion field of the second magnetic layer is larger than an inversion field of the first magnetic layer, and wherein Q given by equation (3), in which Ms is a saturation magnetization of the first magnetic layer, Ku is a perpendicular anisotropy constant, and f is given by equation (4), is not less than 100:

$$Q = \frac{v(Ku - 2\pi Ms^2 f)}{kTa}, \text{ and} \quad (3)$$

$$f=7\times10^{-13}(T/W)^4-2\times10^{-9}(T/W)3+3\times10-^6(T/W)^2-0.0019(T/W)+0.9681, \quad (4)$$

where k is a Boltzmann constant, Ta is a temperature, T is a film thickness, and W is a width.

9. A memory according to claim 8, wherein the inversion field Hc of the first magnetic layer exhibits not more than 200 Oe.

10. A memory according to claim 9, wherein the inversion field Hc of the first magnetic layer exhibits not more than 100 Oe.

11. A memory according to claim 10, wherein the inversion field Hc of the first magnetic layer exhibits not less than 10 Oe.

* * * * *

UNITED STATES PATENT AND TRADEMARK OFFICE
CERTIFICATE OF CORRECTION

PATENT NO. : 6,844,605 B2
DATED : January 18, 2005
INVENTOR(S) : Naoki Nishimura It is certified that error appears in the above-identified patent and that said Letters Patent is hereby corrected as shown below:

Title page,
Item [57] ABSTRACT,
Line 1, "a" (third occurrence) should read -- an --.

Column 1,
Line 27, "decrease," should read -- decreases, --.

Column 2,
Lines 24, 44 and 45, "a" should read -- an --.

Column 3,
Lines 1, 2, 13 and 14, "a" should read -- an --; and
Line 49, "element" should read -- elements --.

Column 4,
Line 41, "has" should read -- was --.

Column 6,
Lines 8, 10, 20, 21 and 43, "rear-earth" should read -- rare-earth --.

Column 7,
Lines 24 and 26, "rear-earth" should read -- rare-earth --.

Column 9,
Line 55, "rear-earth" should read -- rare-earth --.

Column 11,
Lines 18 and 22, "rear-earth" should read -- rare-earth --.

UNITED STATES PATENT AND TRADEMARK OFFICE
CERTIFICATE OF CORRECTION

PATENT NO. : 6,844,605 B2
DATED : January 18, 2005
INVENTOR(S) : Naoki Nishimura It is certified that error appears in the above-identified patent and that said Letters Patent is hereby corrected as shown below:

<u>Column 12,</u>
Line 19, "$f=7\text{X}10^{-13}(T/W)^4-2\text{x}10^{-9}(T/W)3+3\text{x}10^{-6}(T/W)^2-0.0019(T/W)+0.9681, \quad ...(4)$" should read -- $f=7\text{X}10^{-13}(T/W)^4-2\text{x}10^{-9}(T/W)^3+3\text{x}10^{-6}(T/W)^2-0.0019(T/W)+0.9681, \quad ...(4)$ --.

Signed and Sealed this

Twenty-fourth Day of May, 2005

JON W. DUDAS
*Director of the United States Patent and Trademark Office*